(12) United States Patent
Devendorf et al.

(10) Patent No.: US 7,098,684 B2
(45) Date of Patent: Aug. 29, 2006

(54) HIGH SPEED SWITCH

(75) Inventors: Don C. Devendorf, Carlsbad, CA (US);
Seth L. Everton, Torrance, CA (US);
Lloyd F. Linder, Agoura Hills, CA
(US); Michael H. Liou, Northridge, CA
(US)

(73) Assignee: TelASIC Communications, Inc., El
Segundo, CA (US)

( * ) Notice: Subject to any disclaimer, the term of this
patent is extended or adjusted under 35
U.S.C. 154(b) by 179 days.

(21) Appl. No.: 10/740,173

(22) Filed: Dec. 18, 2003

(65) Prior Publication Data

US 2005/0035790 A1  Feb. 17, 2005

Related U.S. Application Data

(60) Provisional application No. 60/495,575, filed on Aug. 14, 2003.

(51) Int. Cl.
*H03K 19/013* (2006.01)
(52) U.S. Cl. .............................. 326/18; 326/17; 326/89
(58) Field of Classification Search .................. 326/17,
326/18, 81, 82, 89, 91
See application file for complete search history.

(56) References Cited

U.S. PATENT DOCUMENTS

| 4,763,107 A | | 8/1988 | Koen et al. | |
|---|---|---|---|---|
| 5,614,844 A | * | 3/1997 | Sasaki et al. | ................. 326/84 |
| 6,369,637 B1 | * | 4/2002 | Kiriaki | ...................... 327/411 |

* cited by examiner

*Primary Examiner*—Daniel Chang
(74) *Attorney, Agent, or Firm*—Morrison & Foerster LLP

(57) ABSTRACT

A high speed switch. The novel switch includes an input circuit having a transistor Q1 for receiving an input signal, a first mechanism for providing a path from an output of Q1 to an output terminal, and a second mechanism for receiving a control signal and in accordance therewith reducing the conductivity of the path during a mute mode. The first mechanism includes a first circuit for providing a first path from an output of Q1 to a first node, and a second circuit for providing a second path connecting the first node to the output terminal. The second mechanism is adapted to apply a signal to the first node during the mute mode such that the first and second circuits are off or partially conducting. The switch also includes a circuit for clamping the first node to a first predetermined voltage during the mute mode.

42 Claims, 6 Drawing Sheets

HIGH SPEED SWITCH

CROSS-REFERENCE TO RELATED APPLICATIONS

This application claims the benefit of U.S. Provisional Application No. 60/495,575, filed Aug. 14, 2003, the disclosure of which is hereby incorporated by reference.

BACKGROUND OF THE INVENTION

1. Field of the Invention

The present invention relates to electronics. More specifically, the present invention relates to switches.

2. Description of the Related Art

Analog to digital converters are widely used for converting analog signals to corresponding digital signals for many electronic circuits. For example, a high resolution, high speed analog to digital converter (ADC) may find application in broadband communications, video circuits, radar, and electronic warfare applications. In the field of analog to digital conversion, there continue to be many driving goals, such as speed, increased number of bits (relating to dynamic range and spur-free operation), power consumption, and size. Two of the most critical specifications remain speed and dynamic range.

The fastest ADC architecture is called "flash" conversion. A flash ADC produces an N-bit digital output in one step using a comparator bank comprised of $2^N-1$ parallel comparators. This architecture, however, is limited in dynamic range to about 8 bits, since the number of comparators grows rapidly as the number of bits N becomes larger. The next fastest converter technique is a subranging pipelined architecture.

Subranging ADCs typically use a low resolution flash quantizer during a first stage or "coarse pass" to convert an analog input signal into the most significant bits (MSB) of its digital value. An analog version of the MSB word, generated by a digital analog converter (DAC), is then subtracted from the input signal at a summing node to produce a residue or residual signal. The residue signal is amplified by an amplifier, and subsequently digitized by one or more additional stages or "fine passes" to produce the least significant bits of the input signal. The digital words produced by each stage are then combined by digital error correcting circuitry to produce a digital output representing the original analog input signal.

In a subranging ADC, the summing node is perhaps the most critical node in the chain. This is because an error appearing at the summing node cannot be corrected by the error correction circuit and will therefore appear as an error in the digital output. The problem that must be overcome is that when the input sample and hold (S/H) circuit begins its next sample, the quantizer and DAC have not reached equilibrium, resulting in a large voltage swing at the summing node. This causes some of the internal stages of the following amplifier to go into saturation. Once this happens, the settling time of the amplifier is lengthened considerably and the speed of conversion is significantly degraded.

A switch is typically used to isolate the amplifier from the summing node during the period when the driving circuits have not reached equilibrium. This switch must switch and settle rapidly. It must also provide isolation when off and provide linear operation when on. Prior art implementations, however, either perturb the summing node by capacitively coupling charge or affect the settling time by switching input stages within the amplifier.

Hence, there is a need in the art for an improved switch offering faster speed and greater accuracy than prior art switches.

SUMMARY OF THE INVENTION

The need in the art is addressed by the high speed switch of the present invention. The novel switch includes an input circuit having a transistor Q1 for receiving an input signal, a first mechanism for providing a path from an output of Q1 to an output terminal, and a second mechanism for receiving a control signal and in accordance therewith reducing the conductivity of the path during a mute mode. The first mechanism includes a first circuit for providing a first path from an output of Q1 to a first node, and a second circuit for providing a second path connecting the first node to the output terminal. The second mechanism is adapted to apply a signal to the first node during the mute mode such that the first and second circuits are off or partially conducting. The switch also includes a circuit for clamping the first node to a first predetermined voltage during the mute mode.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
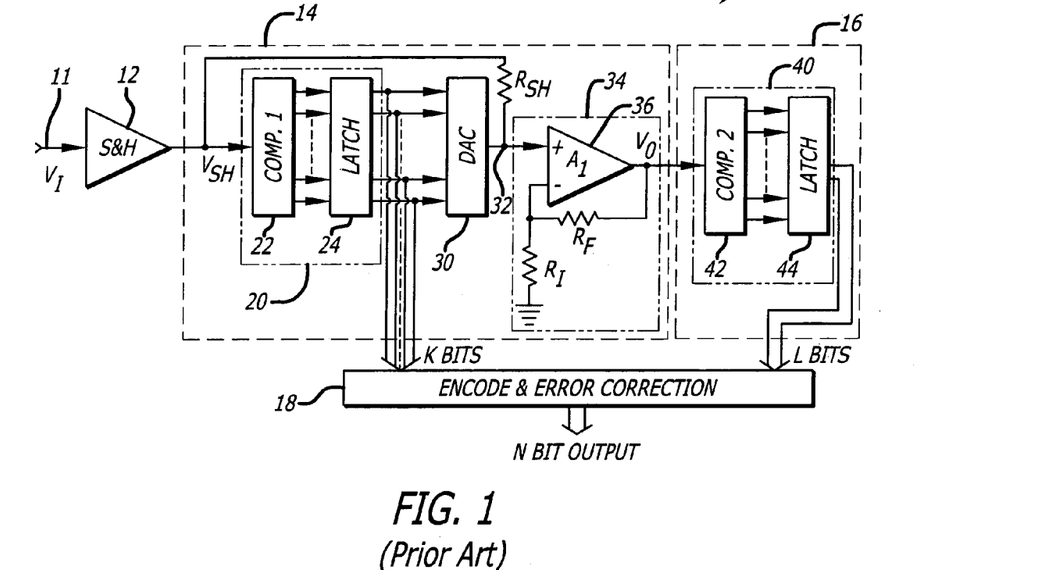
FIG. 1 is a simplified block diagram of a typical subranging analog to digital converter.

FIG. 1 is a simplified block diagram of a typical subranging analog to digital converter (ADC) 10. The example shown is a two stage ADC 10 having a first stage or "coarse pass" 14, and a second stage or "fine pass" 16. A subranging ADC may have additional stages, similar to the first stage 14, connected in series between the coarse pass 14 and the fine pass 16. An analog input signal $V_I$ is applied to an input terminal 11 connected to a sample and hold (S/H) circuit 12, which outputs a voltage $V_{SH}$. The sampled voltage $V_{SH}$ is input to the first subranging stage 14, which includes a first quantizer 20, typically comprised of a comparator bank 22 and latches 24, for digitizing the input signal to K bits; a digital to analog converter (DAC) 30 for generating an analog version of the K-bit word; and a summing node 32 for generating a residue signal by subtracting the output of the DAC 30 from the sampled input signal $V_{SH}$, which is first converted to a current by a resistor $R_{SH}$. The residue signal is then amplified by an amplifier 34 and digitized by the second stage 16, which includes a second quantizer 40, comprised of a comparator bank 42 and latches 44, for generating an L-bit digital output. Error correction logic 18 combines the K-bit and L-bit words to produce an N-bit digital output representing the original analog input signal.

The amplifier 34 is typically a closed loop amplifier including an operational amplifier (op amp) 36 having gain $A_1$, and two resistors $R_I$ and $R_F$ connected in a feedback configuration, with $R_F$ connected between the negative input terminal and the output terminal of the op amp 36 and $R_I$ connected between the negative input terminal and ground. The signal from the summing node 32 is applied to the positive input terminal of the op amp 36.

As discussed above, the summing node 32 is perhaps the most critical node in the chain. In a typical implementation, when $V_{SH}$ and the DAC outputs are stable, the summing node voltage will be +/−64 mV for an input $V_I$ range of +/−2.048 V. The output of the amplifier 34, which usually has a gain of 16 or more, will then be $V_O$=+/−0.064×16=+/−1.024 V. The problem that must be overcome is that when the S/H circuit 12 begins its next sample, the comparators 22, latches 24 and DAC 30 have not reached equilibrium. Therefore, the voltage at the summing node 32 can swing easily +/−0.4 V or so about its designed common mode quiescent point. As an example, assume the summing node voltage swings to −0.4 V. Then the output of the amplifier 34 would try to go to $V_O$=−0.4×16=−6.4 V. This, however, is not possible since the amplifier 34 is designed to be linear over a range close to +/−1.024 V. The result of this inconsistency is that some of the internal stages of the amplifier 34 will saturate. Once this happens, the settling time of the amplifier 34 is lengthened considerably and the speed of conversion is significantly degraded. This is because when the amplifier 34 saturates, it goes open loop and the input differential pair can flip causing a large thermal gradient. This causes an unacceptably long recovery time for the loop to return to stable steady-state closed loop operation.

In implementing the DAC 30 to amplifier 34 circuit interface, steps are therefore taken to minimize the voltage swing at the summing node 32. About the best that can be done while maintaining distortion-free operation is to limit the voltage swing to about +/−0.4 V assuming diode clamps at the summing node 32. This is still too great a swing for the amplifier 34 to handle since the output of the amplifier 34 would be $V_O$=0.4 V×16=6.4 V. The prior art generally attempts to isolate the amplifier 34 from the summing node 32 with switches as shown in FIG. 2.

Figure 2:
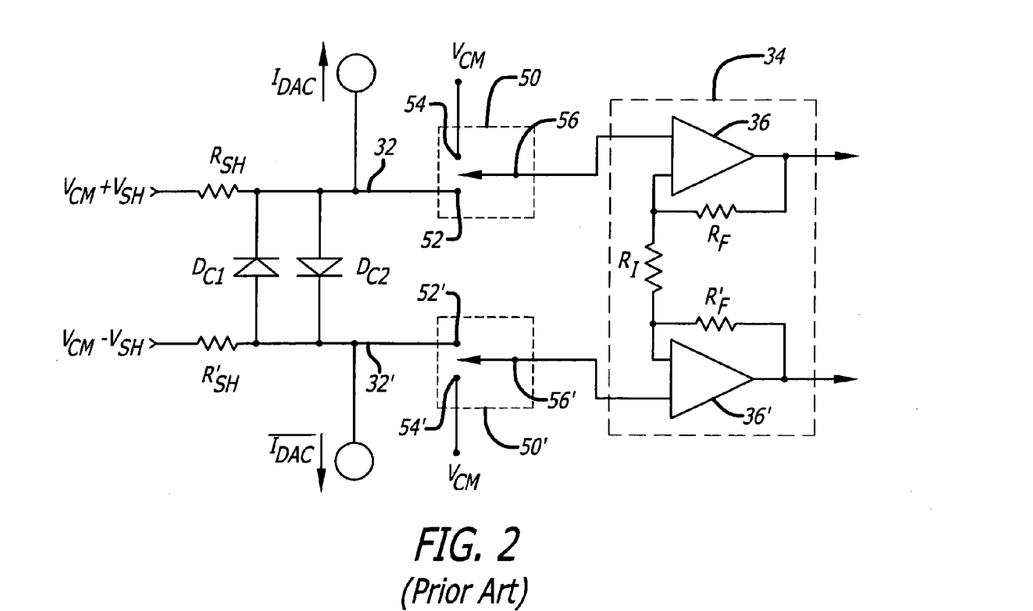
FIG. 2 is a simplified schematic of a conventional system for isolating the amplifier from summing node fluctuations.

FIG. 2 is a simplified schematic of a conventional system for isolating the amplifier 34 from summing node fluctuations. A differential implementation is shown, with differential input signals $V_{CM}+V_{SH}$ and $V_{CM}-V_{SH}$ (where $V_{CM}$ is the common mode voltage) each connected to a summing node 32 and 32', respectively, through a resistor $R_{SH}$ and $R'_{SH}$, respectively; and DAC outputs $I_{DAC}$ and $\bar{I}_{DAC}$ each connected to a summing node 32 and 32', respectively. Two clamping diodes $D_{C1}$ and $D_{C2}$ are each connected between the two summing nodes 32 and 32', $D_{C1}$ having an anode connected to the first summing node 32 and a cathode connected to the second summing node 32', and $D_{C2}$ having an a node connected to the second summing node 32' and a cathode connected to the first summing node 32.

A switch 50, 50' is added to each differential leg, between the summing node 32, 32' and the amplifier 34. Each switch 50 includes two input terminal 52 and 54, a first input terminal 52 connected to the summing node 32 and the second input terminal 54 connected to the common mode voltage $V_{CM}$; and an output terminal 56 connected to an input of the amplifier 34 (labels for the second switch 50' are the same as for the first switch 50, followed by a prime). The output terminal 56 of the first switch 50 is connected to the positive input terminal of a first op amp 36 of the amplifier 34, and the output terminal 56' of the second switch 50' is connected to the positive input terminal of a second op amp 36' of the amplifier 34. A resistor $R_I$ connects the negative input terminals of the op amps 36 and 36', a resistor $R_F$ connects the negative input terminal and output terminal of op amp 36, and a resistor $R'_F$ connects the negative input terminal and output terminal of op amp 36'.

When the S/H output $V_{SH}$ and DAC outputs $I_{DAC}$ and $\bar{I}_{DAC}$ are stable, the switches 50 and 50' connect to the first input terminals 52 and 52', and the amplifier 34 will operate in its linear region. When it is time to enable the next sample, the switches 50 and 50' are moved to the second input terminals 54 and 54', isolating the inputs of the amplifier 34 from the perturbations of the summing nodes 32 and 32'.

Figure 3:
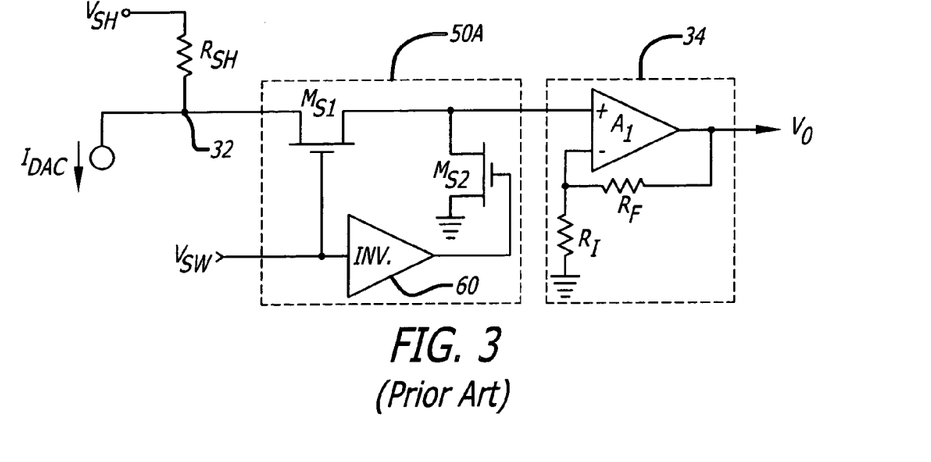
FIG. 3 is a simplified schematic of a conventional switch implementation for summing node isolation.

This switch operation allows the amplifier 34 to always operate in its linear mode. The switches 50 and 50' must switch and settle rapidly. They must also provide isolation when off and provide linear operation when on. FIG. 3 is a simplified schematic of a conventional switch implementation 50A for this application. A single channel is shown for simplicity. The output of the DAC $I_{DAC}$ and the output of the S/H $V_{SH}$ (through a resistor $R_{SH}$) are connected to the summing node 32. A switch 50A is connected between the summing node 32 and the input to the amplifier 34. In this design, the switch action is accomplished by two FET devices $M_{S1}$, and $M_{S2}$. (The switch could, of course, be implemented in some other technology and is not limited to FETs.) The transistor $M_{S1}$, is connected between the summing node 32 and the input to the amplifier 34, and $M_{S2}$ is connected between the input to the amplifier 34 and ground. A control signal $V_{SW}$ is applied to the base of $M_{S1}$, and its complement (generated by an inverter 60) is applied to the base of $M_{S2}$.

In operation, when the switch 50A is in an 'on' or 'active' mode (as determined by the control signal $V_{SW}$), $M_{S1}$ is on and $MS_2$ is off, and the switch 50A connects the summing node 32 to the input of amplifier 34 (similar to the switch 50 in the first position 52 in FIG. 2). When the switch 50A is in an 'off' or 'mute mode, $M_{S1}$ is off and $M_{S2}$ is on, and the summing node 32 is isolated from the amplifier 34 (similar to the switch 50 in the second position 54 in FIG. 2).

The fundamental problem with this implementation is the switching voltage $V_{SW}$ on the gates of $M_{S1}$, and $M_{S2}$ will couple to the summing node 32 because of the rather large gate to source and gate to drain capacitances. The induced glitch will take several tens of nanoseconds to settle to the accuracy required, slowing down the overall speed of the ADC. There are other switch implementations for isolating the summing node 32 from the amplifier 34, but all tend to perturb the summing node 32 when the switch 50 goes from the mute mode to the active mode.

Figure 4:
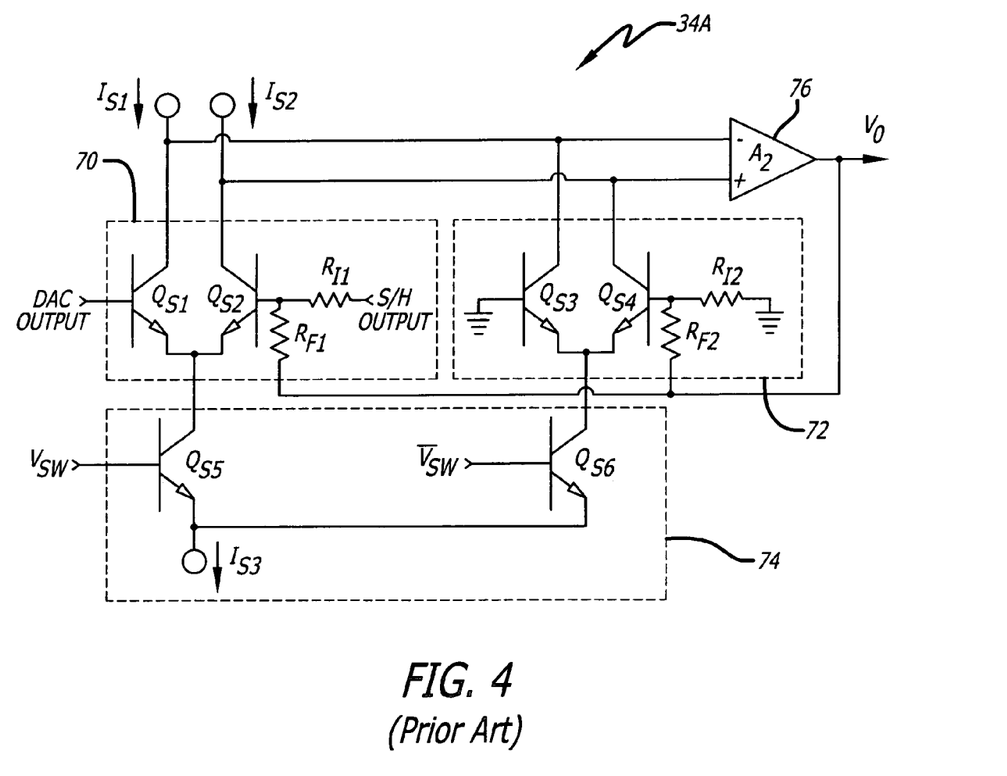
FIG. 4 is a simplified schematic of another conventional amplifier isolation circuit.

FIG. 4 is a simplified schematic of another conventional amplifier isolation circuit 34A, as described in U.S. Pat. No. 4,763,107, entitled "SUBRANGING ANALOG-TO-DIGITAL CONVERTER WITH MULTIPLEXED INPUT AMPLIFIER ISOLATION CIRCUIT BETWEEN SUBTRACTION NODE AND LSB ENCODER," the teachings of which are incorporated herein by reference. This approach adds a switch 74 inside the amplifier 34A to switch between two input circuits 70 and 72, the first input circuit 70 coupled to the DAC and S/H, and the other input circuit 72 coupled to ground.

The amplifier 34A includes two input circuits 70 and 72, and a switching circuit 74 adapted to receive a control signal $V_{SW}$ and in accordance therewith couple either the first input circuit 70 or the second input circuit 72 to an op amp 76. The first input circuit 70 includes a differential input pair $Q_{S1}$ and $Q_{S2}$. The base of $Q_{S1}$ is connected to the output from the DAC, and the collector is coupled to a current source $I_{S1}$ and the negative terminal of the op amp 76. The base of $Q_{S2}$ is connected to the output from the S/H through a resistor $R_{I1}$, and to the output terminal of the op amp 76 through a resistor $R_{F1}$, and the collector is coupled to a current source $I_{S2}$ and the positive terminal of the op amp 76. The second input circuit 72 includes a differential input pair $Q_{S3}$ and $Q_{S4}$. The base of $Q_{S3}$ is connected to ground, and the collector is coupled to $I_{S1}$ and the negative terminal of the op amp 76. The base of $Q_{S4}$ is connected to ground through a resistor $R_{I2}$ and to the output terminal of the op amp 76 through a resistor $R_{F1}$, and the collector is coupled to $I_{S2}$ and the positive terminal of the op amp 76. The switching circuit 74 includes a differential pair $Q_{S5}$ and $Q_{S6}$, having emitters connected in common to a current source $I_{S3}$, and bases connected to complementary control signals $V_{SW}$ and $\overline{V}_{SW}$, respectively. The collector of $Q_{S5}$ is connected to the common emitters of $Q_{S1}$ and $Q_{S2}$, and the collector of $Q_{S6}$ is connected to the common emitters of $Q_{S3}$ and $Q_{S4}$.

This approach tends to impact the settling time when switched from mute to active since the switching circuitry is located within the closed loop of the amplifier 34A. This circuit, while keeping the op amp 76 from going into saturation, requires longer to settle because the switching is performed inside the loop. The overall loop must settle and this settling time is unacceptable and prohibitive for high speed applications.

The present invention describes a fast settling single pole double throw (SPDT) switch that provides over 60 dB isolation between the summing node and the following amplifier during the period when the driving circuits have not reached equilibrium. It also does not perturb the amplifier input node when switching either from on to off or from off to on. The switch employs bootstrapping techniques to provide excellent linearity, precision gain and stability. It is an open loop configuration, which is inherently very broadband, and has been designed specifically to switch from off to on very quickly therefore settling very rapidly. This allows the switch to be used in very high speed applications. The summing node common mode voltage is held constant by the switch for both the active (on) and mute (off) modes. Because the common mode voltage is constant, fast recovery (settling) of the following amplifier when switching from mute to active is achieved.

Figure 5:
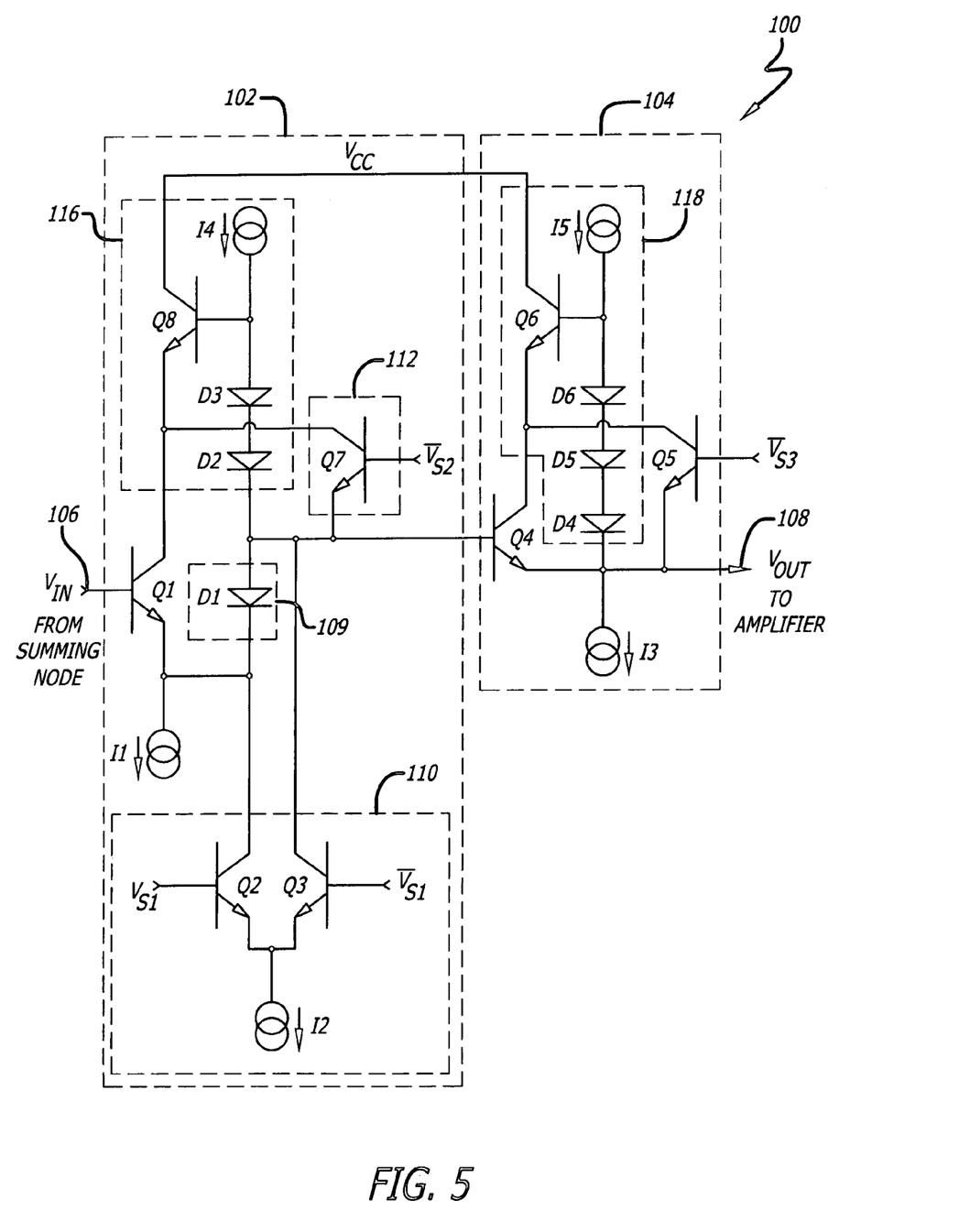
FIG. 5 is a simplified schematic of an illustrative embodiment of a switch designed in accordance with the teachings of the present invention.

FIG. 5 is a simplified schematic of an illustrative embodiment of a switch 100 designed in accordance with the teachings of the present invention. The novel switch 100 includes an input circuit 102, comprised of a transistor Q1 biased at the emitter with a current source I1, and an output circuit 104, including a transistor Q4 biased at the emitter with a current source I3. An input signal $V_{IN}$ (from the summing node) is applied to an input terminal 106 at the base of Q1, and an output signal $V_{OUT}$ (which is input to the amplifier) is taken at an output terminal 108 at the emitter of Q4.

In accordance with the teachings of the present invention, the switch 100 includes a circuit 109 for providing a first path connecting the emitter of Q1 to the base of Q4, and a switching circuit 110 adapted to receive a control signal $V_{S1}$ and in accordance therewith reduce the conductivity of the path to attenuate the signal input to Q4 during the mute mode. The transistor Q4 provides a second path connecting the output from the first path circuit 109 to the output terminal 108, and the switching circuit 110 may also be adapted to aid in turning off or reducing the conductivity of the second path during the mute mode to further attenuate any signal that passes through the first path.

In the illustrative embodiment, the circuit 109 is a diode D1 having an anode connected to the base of Q4 and a cathode connected to the emitter of Q1, and the switching circuit 110 is a current switch comprised of a differential pair Q2 and Q3, having emitters connected in common to a current source I2. The base of Q2 is coupled to the control signal $V_{S1}$ and the collector is coupled to the cathode of D1. The base of Q3 is coupled to the control signal $\overline{V}_{S1}$, which is the complement of $V_{S1}$, and the collector is coupled to the anode of D1. The control signals $V_{S1}$ and $\overline{V}_{S1}$ are designed to turn Q2 on and Q3 off during the active mode, and turn Q2 off and Q3 on during the mute mode.

The novel switch 100 also includes a circuit 112 adapted to clamp the base of Q4 to a predetermined voltage to turn off or reduce the conductivity of Q4 during the mute mode. The circuit 112 includes a transistor Q7 having a base coupled to a control signal $\overline{V}_{S2}$, an emitter connected to the base of Q4, and a collector coupled to the collector of Q1. The control signal $\overline{V}_{S2}$ is a level shifted version of $\overline{V}_{S1}$, so it switches between the active and mute modes at the same time, but the voltage levels are chosen to turn Q7 on and turn Q4 off or slightly conducting during the mute mode, and turn Q7 off and Q4 on during the active mode.

In the embodiment of FIG. 5, which is designed for a summing node isolation application, the output circuit 104 also includes a transistor Q5 adapted to apply a predefined voltage to the output terminal 108 when the input circuit 102 is in the mute mode. The transistor Q5 has a base coupled to a control signal $\overline{V}_{S3}$, an emitter connected to the output node 108, and a collector coupled to the collector of Q4. The control signal $\overline{V}_{S3}$ is a level shifted version of $\overline{V}_{S1}$, so it switches between the active and mute modes at the same time, but the voltage levels are chosen to turn Q5 off during the active mode, and turn Q5 on and apply a desired voltage to the output node 108 during the mute mode.

The switch 100 also includes bootstrapping circuits 116 and 118 for reducing distortions due to the Early effect (or channel length modulation) by regulating the voltages across the transistors in the signal path such that those voltages remain constant. This can be implemented using bootstrapping circuits that tie the voltage at the collector (or source/drain) of a transistor to a voltage in the signal path. In the input circuit 102, the circuit 116 bootstraps the transistors Q1 and Q7. The circuit 116 includes a transistor Q8 having an emitter coupled to the collectors of Q1 and Q7, a collector coupled to a DC power supply $V_{CC}$, and a base coupled to a current source I4. A level shifting circuit, comprised of two diodes D2 and D3 in series, level shifts the voltage at the base of Q4 to the base of Q8.

Similarly, the circuit 118 bootstraps the transistors Q4 and Q5. The circuit 118 includes a transistor Q6 having an emitter coupled to the collectors of Q4 and Q5, a collector coupled to a DC power supply $V_{CC}$, and a base coupled to a current source I5. A level shifting circuit, comprised of three diodes D4, D5 and D6 in series, level shifts the voltage at the output node 108 to the base of Q6.

Note that the illustrative bootstrapping circuits 116 and 118 shown in FIG. 5 are open loop, feedback, and feed forward configurations. The invention, however, is not limited thereto. Other bootstrapping techniques may be used without departing from the scope of the present teachings.

The circuit's operation will now be described using sample values as listed in the following table:

| | | |
|---|---|---|
| $V_{CC}$ | +5 V | |
| $V_{BE}$ | 0.8 V (when transistor is on or conducting) | |
| $V_{DIODE}$ | 0.8 V | |
| I1 | 1.0 mA | |
| I2 | 3.0 mA | |
| I3 | 3.0 mA | |
| I4 | 2.0 mA | |
| I5 | 2.0 mA | |
| $V_{S1}$ | −2.4 V (active) | −2.8 V (mute) |
| $\overline{V}_{S1}$ | −2.8 V (active) | −2.4 V (mute) |
| $V_{S2}$ | −1.2 V (active) | −0.4 V (mute) |
| $V_{S3}$ | −1.8 V (active) | −1.0 V (mute) | where $V_{BE}$ is the base to emitter voltage across a transistor and $V_{DIODE}$ is the voltage drop across a diode.

For this example, assume the input $V_{IN}$ to the switch is in the range of −1 V+/−64 mV. To optimize settling time, the output $V_{OUT}$ of the switch is designed to be −1.8 V+/−64 mV. Therefore, the amplifier 34 following the switch 100 will work around a common mode (CM) voltage of −1.8 V.

First, assume the circuit 100 is in the active mode. This mode is similar to switch position 52 in FIG. 2. In the active mode, Q2 is on and Q3 is off, Q7 is off and Q5 is off. The emitter of Q1 is at −1.8 V+/−64 mV. The +/−64 mV represents the LSB (least significant bit) size of the DAC 30. (This assumes K=5 for the first stage.) Since Q2 is on, the current I4 will flow through D1; therefore, the base of Q4 will be at −1.0 V +/−64 mV (remember that Q7 is off). With the base of Q4 at −1.0 V+/−64 mV, the emitter of Q4 will be −1.8 V+/−64 mV since Q5 is off. So the output voltage $V_{OUT}$=−1.8 V+/−64 mV, where −1.8 V is the designed input common mode voltage for the following amplifier 34.

Now switch to the mute mode. This mode is analogous to switch position 54 in FIG. 2. Recall that, because of the delay between the DAC and the S/H output, the summing node voltage can experience large swings. If diode clamps are implemented (as shown in FIG. 2), the differential voltage swings will be limited to +/−0.4 V. The design goal for the mute mode is to allow the switch input voltage $V_{IN}$ to vary over a range of −1.0 V+/−0.4 V, while holding the switch output voltage $V_{OUT}$ at the desired input common mode (CM) voltage of the amplifier (−1.8 V). By holding the input to the amplifier constant at the CM voltage, the amplifier will not go into saturation, and once the switch 100 is placed in the active mode, there will be no delay in the amplifier settling time.

In the mute mode, Q2 is off, Q3 is on, Q7 is on and Q5 is on. As a result, there are two levels of isolation provided by this switch structure in the mute mode. Starting at Q7, with the base of Q7=−0.4 V, the emitter of Q7=−1.2 V since Q3 is on. With the emitter of Q1 at −1.8 V+/−64 mV, the voltage across D1 is −0.6 V, which means that it is conducting but not fully (it is in a very high resistance part of its I/V curve). Since Q7 is on, the emitter of Q7 is held at −1.2 V and any variations of the input voltage are greatly attenuated. Now, looking at the output section, Q5 is on and its emitter is clamped at −1.8 V since the mute voltage on its base is −1.0 V. This holds the output voltage $V_{OUT}$ at the desired CM voltage of −1.8 V. Since the base of Q4 is −1.2 V and the emitter of Q4 is −1.8 V, it is also slightly conducting. Since Q5 is on, any small variations on the base of Q4 will again be attenuated.

Looking at the signal path during the mute mode, Q1 is always operating in its linear mode, D1 is slightly conducting and Q4 is slightly conducting. Partial conductivity is allowed in D1 and Q4 because there is still one level of isolation at Q5 to maintain 60 dB of isolation at the output of the amplifier. The switch has approximately 60 dB of attenuation in the mute mode, far in excess of what is needed to keep the amplifier from going into saturation. The reason for allowing the components in the signal path to conduct slightly is that, when switched into the active mode, they have almost no recovery time and therefore no delay. This makes the time to settle extremely short.

In the active mode, design techniques have been implemented in this invention to further increase its linearity. Both Q1 and Q4 are bootstrapped to minimize the Early effect and to improve not only the linearity, gain accuracy and stability but also the operating bandwidth of the signal path. Additionally, the noise of the open loop structure in active mode is very low so that it does not degrade the SNR (signal to noise ratio) of the ADC as opposed to conventional circuits.

Thus, the present invention isolates the summing node from the input of the amplifier during the period when the driving circuits have not reached equilibrium. Even more importantly, when it switches from the mute mode to the active mode it does not perturb the summing node common mode voltages. Benefits of this invention include fast switching and settling from mute-to-active and active-to-mute modes, excellent linearity, gain accuracy and low harmonic distortion in the active mode. The circuit exhibits low noise in the active mode and has minimum delay. In the mute mode it has four areas of isolation, as it forms a series shunt-series shunt isolation path, allowing for large summing node transients without compromising isolation.

Figure 6:
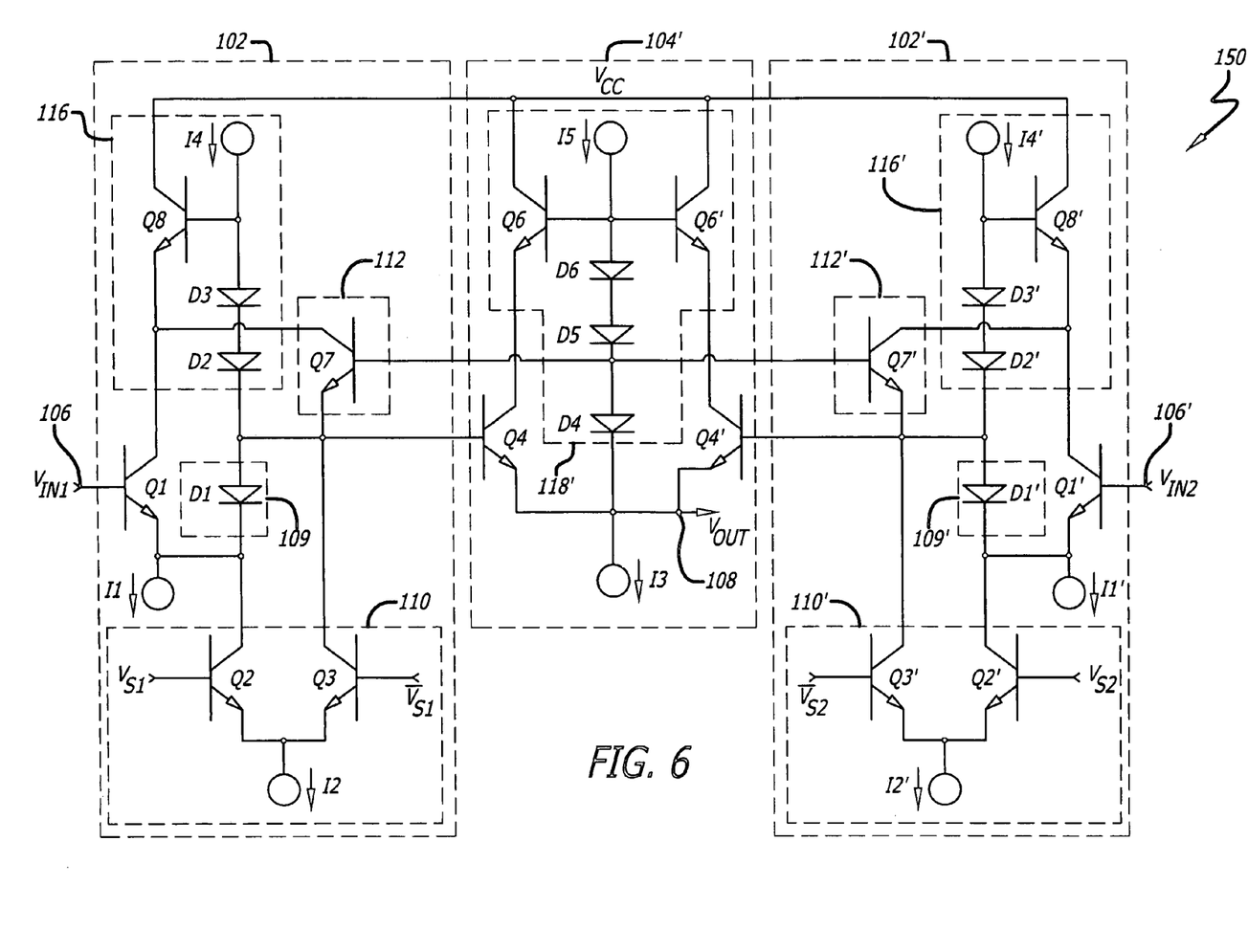
FIG. 6 is a simplified schematic of an illustrative embodiment of a multiplexer designed in accordance with the teachings of the present invention.

While the invention has thus been described with reference to a specific application of the SPDT switch, it should be pointed out that a more general, symmetric, SPDT switch is a direct extension of this implementation. FIG. 6 shows how the circuit can be modified to function as a two input multiplexer (MUX).

FIG. 6 is a simplified schematic of an illustrative embodiment of a multiplexer 150 designed in accordance with the teachings of the present invention. By replicating the input stage 102 of the switch 100 of FIG. 5, as previously described, as a mirror image, and connecting it as an input to Q5 (labeled Q4' in FIG. 6), the circuit 150 operates with complete symmetry.

The two input MUX 150 includes two input circuits 102 and 102', and an output circuit 104'. The output circuit 104' includes two output transistors Q4 and Q4' having bases coupled to the outputs of the input circuits 102 and 102', respectively, and emitters connected in common to a current source I3. The output terminal 108 is coupled to the emitters of Q4 and Q4'. The output circuit 104' also includes a bootstrapping circuit 118' comprised of transistors Q6 and Q6' having emitters coupled to the collectors of Q4 and Q4', respectively, collectors connected to $V_{CC}$, and bases connected in common to a current source I5. A level shifting circuit comprised of three diodes D4, D5, and D6 in series (the cathode of D4 is connected to the output terminal 108) level shifts the voltage $V_{OUT}$ at the output terminal 108 to the bases of Q6 and Q6'.

The first input circuit 102 is identical to that shown in FIG. 5, except the base of Q7 is now connected to the anode of D4. The second input circuit 102' is identical to the first circuit 102, except a first input signal $V_{IN1}$ is applied to the input terminal 106 of circuit 102 and a second input signal $V_{IN2}$ is applied to the input terminal 106' of circuit 102', and a first set of control signals $V_{S1}$ and $\overline{V}_{S1}$ is applied to the switching circuit 110 of circuit 102 and a second set of control signals $V_{S2}$ and $\overline{V}_{S2}$ is applied to the switching circuit 110' of circuit 102' (for a two input MUX, $V_{S2}=\overline{V}_{S1}$ and $\overline{V}_{S2}=V_{S1}$). The components of circuit 102' are labeled similar to the corresponding components of circuit 102, followed by a prime (').

The operation of the MUX 150 is similar to the switch 100 of FIG. 5, except that instead of switching $V_{OUT}$ between $V_{IN}$ and the voltage defined by $\overline{V}_{S3}$, the MUX 150 switches $V_{OUT}$ between $V_{IN1}$ and $V_{IN2}$. The bases of Q7 and Q7' are now connected to the anode of D4. This effectively clamps the emitter of the transistor in the "off" side to equal $V_{OUT}$, thereby ensuring that either Q4 or Q4' (whichever side is turned off) is always held in the off state. The control signals at the bases of Q2, Q3 and Q2', Q3' operate at current mode logic levels and therefore contribute low transient coupling to the output. The following table gives a sample switching voltage truth table:

| $V_{S1}$ | $\overline{V}_{S1}$ | $V_{S2}$ | $\overline{V}_{S2}$ | |
|---|---|---|---|---|
| −2.4 | −2.8 | −2.8 | −2.4 | $V_{OUT} = V_{IN1}$ |
| −2.8 | −2.4 | −2.4 | −2.8 | $V_{OUT} = V_{IN2}$ |

Figure 7:
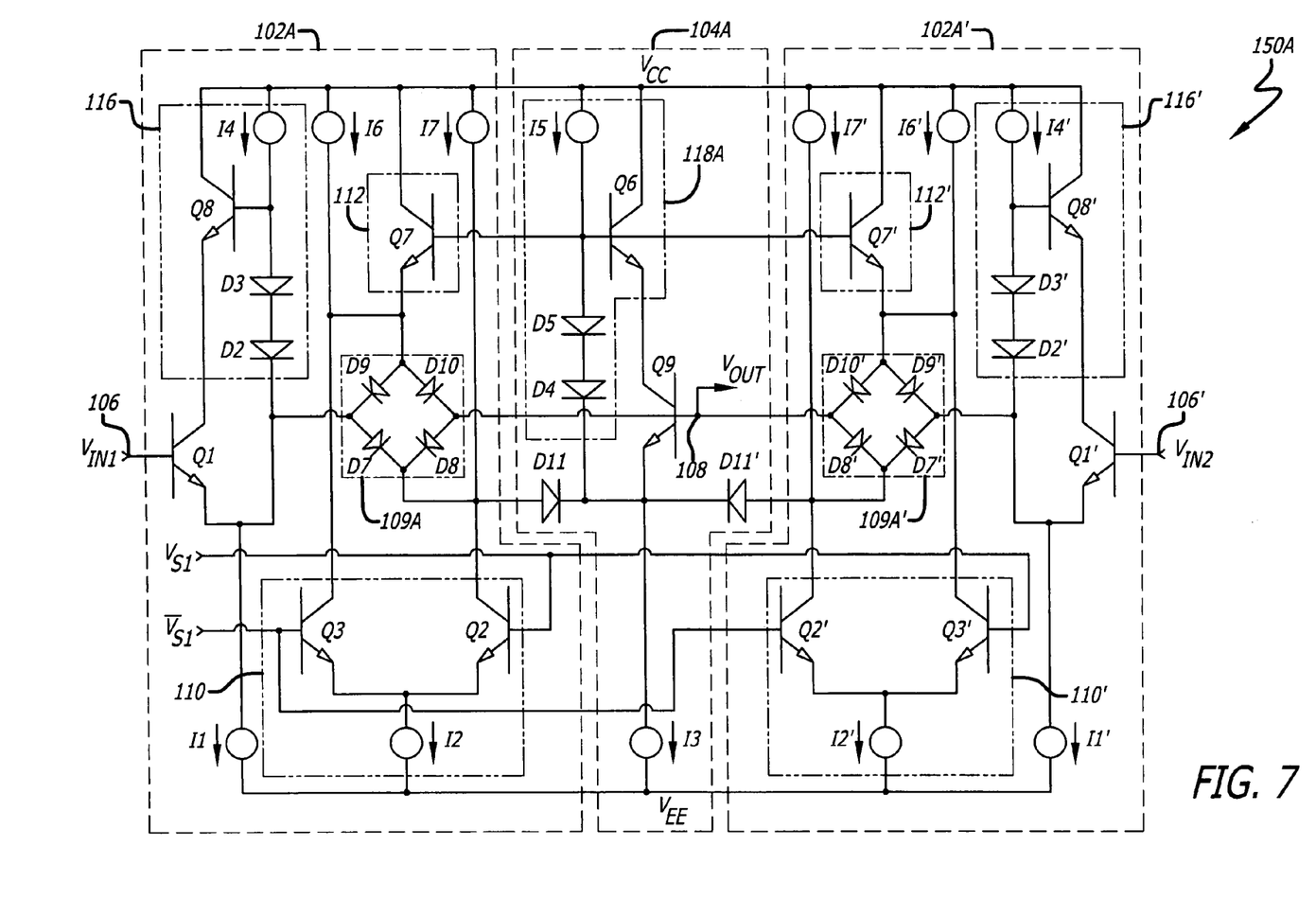
FIG. 7 is a simplified schematic of an alternative illustrative embodiment of a multiplexer designed in accordance with the teachings of the present invention, showing how diode bridges can be used as the gating elements.

FIG. 7 is a simplified schematic of an alternative illustrative embodiment of a multiplexer 150A designed in accordance with the teachings of the present invention, showing how diode bridges can be used as the gating elements. The two input MUX 150A includes two symmetrical input circuits 102A and 102A', and an output circuit 104A. The input circuit 102A is similar to the input circuit 102 of FIG. 6, except the diode D1 and transistor Q4, which connected the output of Q1 to the output terminal 108, is now replaced with a diode bridge 109A, comprised of diodes D7, D8, D9, and D10. The cathode of D9 and anode of D7 are connected to the emitter of Q1. The cathode of D10 and anode of D8 are connected to the output terminal 108. The cathodes of D7 and D8 are connected to the collector of Q2. The anodes of D9 and D10 are connected to the emitter of Q7. The collector of Q7 is connected to $V_{CC}$ instead of the bootstrapping circuit 116, and the base is connected to the base of Q6 (in the output circuit 104A). Current sources I6 and I7 are added between $V_{CC}$ and the collectors of Q3 and Q2, respectively.

The second input circuit 102A' is identical to the first circuit 102A, except a first input signal $V_{IN1}$ is applied to the input terminal 106 of circuit 102A and a second input signal $V_{IN2}$ is applied to the input terminal 106' of circuit 102A', a control signal $V_{S1}$ is applied to Q2 of circuit 102A and to Q3' of circuit 102A', and a control signal $\overline{V}_{S1}$ is applied to Q3 of circuit 102A and Q2' of circuit 102A'. The components of circuit 102A' are labeled similar to the corresponding components of circuit 102A, followed by a prime (').

The output circuit 104A includes a transistor Q9 having a base connected to the output terminal 108 and an emitter connected to a current source I3, and a bootstrapping circuit 118A comprised of a transistor Q6 having an emitter coupled to the collector of Q9, a collector coupled to $V_{CC}$, and a base coupled to a current source I5. A level shifting circuit comprised of two diodes D4 and D5 in series (the cathode of D4 connected to the emitter of Q9) level shift the voltage at the emitter of Q9 to the base of Q6. A diode D11 is connected with an anode at the collector of Q2 and a cathode at the emitter of Q9, and a diode D11' is connected with an anode at the collector of Q2' and a cathode at the emitter of Q9.

If the control signal $V_{S1}$=logic1 and $\overline{V}_{S1}$=logic0, then Q2 is on and Q3 is off, and D11 is off, therefore I6 flows through the diode bridge 109A. Since the diodes of the bridge 109A are matched diode-connected transistors, their voltage drops are matched and the voltage on the cathode of D10 is equal to the voltage on the cathode of D9. Therefore, $V_{OUT}=V_{IN1}-V_{BEQ1}$, where $V_{BEQ1}$ is the base to emitter voltage of Q1. Q7 is off since the voltages on the anode of D9 and on the base of Q7 are equal. The other side of the MUX (the input circuit 102A' for the second input signal $V_{IN2}$) is off since Q2' is off and Q3' is on, D11' is conducting, and therefore, the diode bridge 109A' is zero biased. This MUX 150A is designed for maximum bandwidth and switching speed for low level signals. The following table gives sample values for the current sources in FIG. 7:

| | |
|---|---|
| I1, I1' | 2 mA |
| I2, I2' | 2 × I6 |
| I3 | 3 mA |
| I4, I4' | 1 mA |
| I5 | 1 mA |
| I6, I6' | 1 mA |
| I7, I7' | 1 mA |

Figure 8:
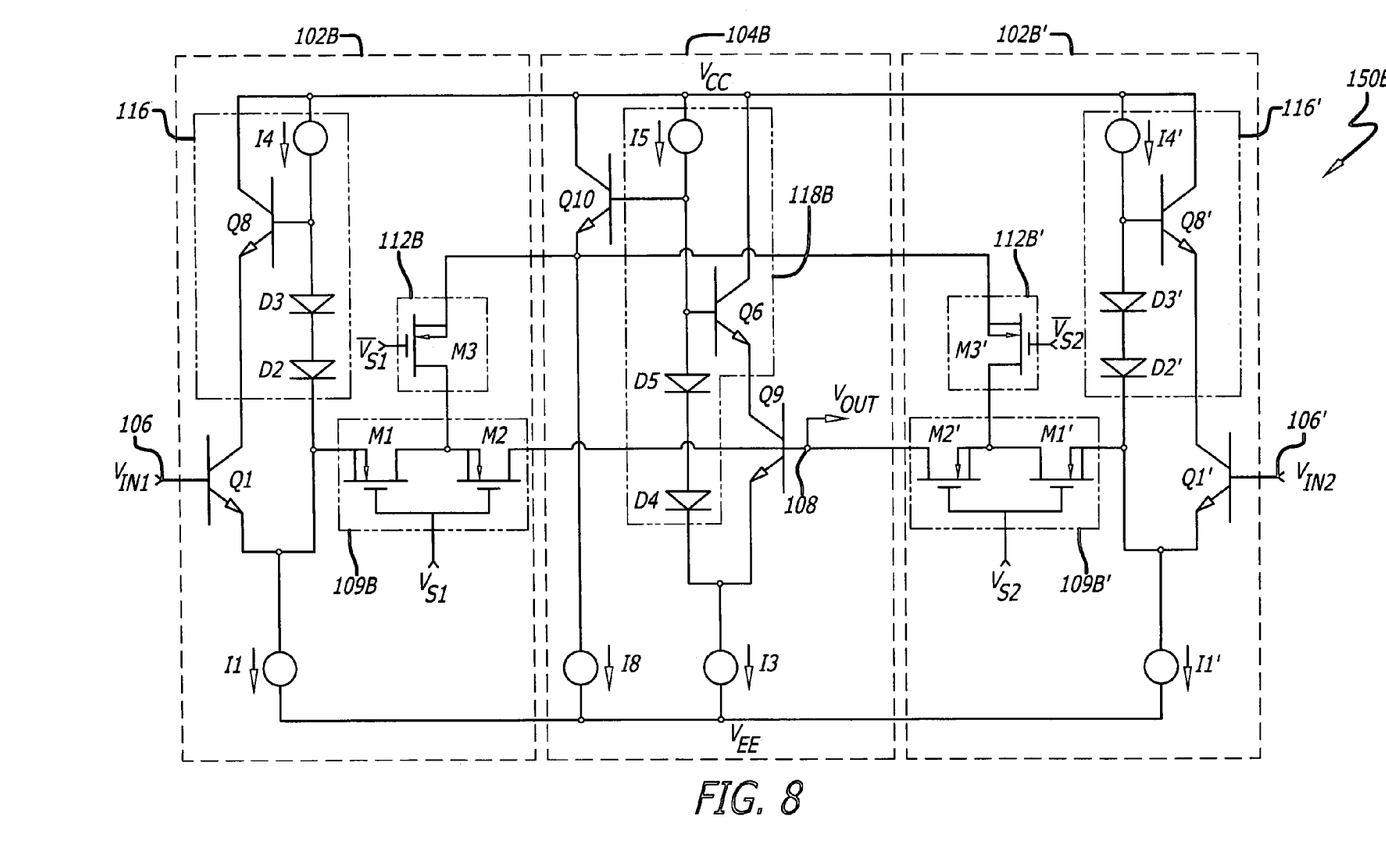
FIG. 8 is a simplified schematic of an alternative illustrative embodiment of a multiplexer designed in accordance with the teachings of the present invention, showing a BiCMOS implementation.

FIG. 8 is a simplified schematic of an alternative illustrative embodiment of a multiplexer 150B designed in accordance with the teachings of the present invention, showing a BiCMOS implementation. The two input MUX 150B includes two symmetrical input circuits 102B and 102B', and an output circuit 104B. As in the embodiment of FIG. 6, the input circuit 102B includes an input transistor Q1 biased at the emitter by a current source I1 and a circuit 116 for bootstrapping the voltage across Q1. The diode D1, switching circuit 110, and output transistor Q4 (in FIG. 6) are replaced with a circuit 109B for providing a path between the emitter of Q1 and the output terminal 108, and adapted to receive a control signal $V_{S1}$ and in accordance therewith reduce the conductivity of the path to attenuate the signal applied to the output 108.

The circuit 109B includes two FET transistors M1 and M2 connected in series. The FETs can be either PMOS or NMOS technology. In the illustrative embodiment of FIG. 8, M1 and M2 are PMOS FETs, with the source of M1 connected to the emitter of Q1, the drain of M1 connected to the source of M2, and the drain of M2 connected to the output terminal 108. The gates of M1 and M2 are coupled to the control signal $V_{S1}$, which is adapted to turn M1 and M2 on when the input circuit 102B is in the active mode, and switch M1 and M2 off during the mute mode. The input circuit 102B also includes a circuit 112B adapted to receive a control signal $\overline{V}_{S1}$ and in accordance therewith clamp the voltage at the node between M1 and M2. In this embodiment, the circuit 112B includes an FET M3 having a drain connected to the node between M1 and M2, a gate coupled to $\overline{V}_{S1}$, and a source connected to the emitter of a transistor Q10 in the output circuit 104B.

The second input circuit 102B' is identical to the first circuit 102B, except a first input signal $V_{IN1}$ is applied to the input terminal 106 of circuit 102B and a second input signal $V_{IN2}$ is applied to the input terminal 106' of circuit 102B', and a first set of control signals $V_{S1}$ and $\overline{V}_{S1}$ is applied to circuits 109B and 112B, respectively, of circuit 102B and a second set of control signals $V_{S2}$ and $\overline{V}_{S2}$ is applied to circuits 109B' and 112B', respectively, of circuit 102B' (for a two input MUX, $V_{S2}=\overline{V}_{S1}$ and $\overline{V}_{S2}=V_{S1}$). The components of circuit 102B' are labeled similar to the corresponding components of circuit 102B, followed by a prime (').

The output circuit 104B includes a transistor Q9 having a base connected to the output terminal 108 and an emitter connected to a current source I3, and a bootstrapping circuit 118B comprised of a transistor Q6 having an emitter coupled to the collector of Q9, a collector coupled to $V_{CC}$, and a base coupled to a current source I5. A level shifting circuit comprised of two diodes D4 and D5 in series (the cathode of D4 connected to the emitter of Q9) level shift the voltage at the emitter of Q9 to the base of Q6. The output circuit 104B also includes a transistor Q10 for applying a voltage $V_{OUT}$ to the source of M3. The base of Q10 is connected to the base of Q6, the collector is connected to $V_{CC}$, and the emitter is connected to the source of M3 and to a current source I8.

Thus, when $V_{S1}$=logic1 and $\overline{V}_{S1}$=logic0, M1 and M2 are on, M3 is off, and $V_{OUT}=V_{IN1}$. When $V_{S1}$=logic0 and $\overline{V}_{S1}$=logic1, M1 and M2 are off, M3 is on, and $V_{OUT}=V_{IN2}$. M3 acts as a shunt element to provide improved isolation for the "off" switch. In the "off" mode, M3 provides a bias equal to $V_{OUT}$ at a low impedance to the drains of M1 and M2, so that the on/off or off/on transients are small across the FET drain to source voltage $V_{DS}$. These FETs are bootstrapped so that the FET control signals can be made as low as possible to minimize switching transients.

It should be clear to one of ordinary skill in the art that the circuits described above could be modified to function as multiple input MUXs by adding more input sections.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A switch comprising:
   an input circuit having a transistor Q1 for receiving an input signal;
   first means for providing a path from an output of Q1 to an output terminal; and
   second means for receiving a control signal and in accordance therewith reducing the conductivity of said path during a mute mode,
   wherein said first means includes a first circuit for providing a first path from an output of Q1 to a first node,
   wherein said first circuit includes a diode D1,
   wherein the cathode of D1 is connected to the emitter of Q1 and the anode of D1 is connected to said first node,
   wherein said second means is adapted to turn off said diode D1 during said mute mode, and
   wherein said second means is adapted to apply a voltage to said diode D1 during said mute mode such that said diode D1 is partially conducting.

2. The invention of claim 1 wherein said first means further includes a second circuit for providing a second path connecting said first node to said output terminal.

3. The invention of claim 2 wherein said second circuit includes a transistor Q4.

4. The invention of claim 3 wherein the base of Q4 is coupled to said first node and the emitter of Q4 is coupled to said output terminal.

5. The invention of claim 3 wherein said second circuit further includes a current source I3 coupled to the emitter of Q4.

6. The invention of claim 3 wherein said second means is adapted to turn off said transistor Q4 during said mute mode.

7. The invention of claim 1 wherein said input circuit further includes a current source I1 coupled to the emitter of Q1.

8. The invention of claim 1 wherein the base of Q1 is coupled to the input signal.

9. A switch comprising:
   an input circuit having a transistor Q1 for receiving an input signal;
   first means for providing a path from an output of Q1 to an output terminal; and
   second means for receiving a control signal and in accordance therewith reducing the conductivity of said path during a mute mode,
   wherein said first means includes a first circuit for providing a first path from an output of Q1 to a first node,
   wherein said second means includes a switching circuit, and
   wherein said switching circuit includes a differential pair Q2 and Q3 having emitters connected in common to a current source I2.

10. The invention of claim 9 wherein the collector of Q2 is coupled to the emitter of Q1 and the collector of Q3 is coupled to said first node.

11. The invention of claim 10 wherein the base of Q2 is coupled to a control signal $V_{S1}$ and the base of Q3 is coupled to a control signal $\overline{V}_{S1}$, which is the complement of $V_{S1}$.

12. The invention of claim 11 wherein said control signals $V_{S1}$ and $\overline{V}_{S1}$ are adapted to turn Q2 on and Q3 off during an active mode, and to turn Q2 off and Q3 on during a mute mode.

13. A switch comprising:
   an input circuit having a transistor Q1 for receiving an input signal;
   first means for providing a path from an output of Q1 to an output terminal; and
   second means for receiving a control signal and in accordance therewith reducing the conductivity of said path during a mute mode,
   wherein said first means includes a first circuit for providing a first path from an output of Q1 to a first node,
   wherein said second means includes a switching circuit,
   wherein said first means further includes a second circuit for providing a second path connecting said first node to said output terminal,
   wherein said second circuit includes a transistor Q4, and
   wherein said second means is adapted to apply a voltage to said transistor Q4 during said mute mode such that Q4 is partially conducting.

14. A switch comprising:
   an input circuit having a transistor Q1 for receiving an input signal;

first means for providing a path from an output of Q1 to an output terminal; and second means for receiving a control signal and in accordance therewith reducing the conductivity of said path during a mute mode, wherein said first means includes a first circuit for providing a first path from an output of Q1 to a first node, and wherein said second means includes a third circuit for clamping said first node to a first predetermined voltage during said mute mode.

15. The invention of claim 14 wherein said third circuit includes a transistor Q7.

16. The invention of claim 15 wherein the emitter of Q7 is connected to said first node.

17. The invention of claim 15 wherein said the collector of Q7 is coupled to the collector of Q1.

18. The invention of claim 15 wherein the base of Q7 is coupled to a control signal $\bar{V}_{S2}$ adapted to turn Q7 off during an active mode, and to turn Q7 on and apply said first predetermined voltage during said mute mode.

19. The invention of claim 15 wherein said switch further includes a bootstrapping circuit adapted to regulate the voltage across Q7 such that said voltage remains constant.

20. The invention of claim 14 wherein said first predetermined voltage is chosen to reduce the conductivity of said second path during said mute mode.

21. A switch comprising:

an input circuit having a transistor Q1 for receiving an input signal;

first means for providing a path from an output of Q1 to an output terminal; and second means for receiving a control signal and in accordance therewith reducing the conductivity of said path during a mute mode, wherein said switch further includes a fourth circuit for clamping said output terminal to a second predetermined voltage during said mute mode.

22. The invention of claim 21 wherein said fourth circuit includes a transistor Q5.

23. The invention of claim 22 wherein the emitter of Q5 is coupled to said output terminal.

24. The invention of claim 22 wherein the base of Q5 is coupled to a control signal $\bar{V}_{S3}$ adapted to turn Q5 off during an active mode, and to turn Q5 on and apply said second predetermined voltage during said mute mode.

25. The invention of claim 22 wherein said switch further includes a bootstrapping circuit adapted to regulate the voltage across Q5 such that said voltage remains constant.

26. A switch comprising:

an input circuit having a transistor Q1 for receiving an input signal;

first means for providing a path from an output of Q1 to an output terminal; and second means for receiving a control signal and in accordance therewith reducing the conductivity of said path during a mute mode, wherein said switch further includes third means for regulating the collector-emitter voltages across transistors in the signal path such that said voltages remain constant.

27. A switch comprising:

an input circuit having a transistor Q1 for receiving an input signal;

first means for providing a path from an output of Q1 to an output terminal; and second means for receiving a control signal and in accordance therewith reducing the conductivity of said path during a mute mode, wherein said switch further includes third means for regulating the voltages across transistors in the signal path such that said voltages remain constant, and wherein said third means includes a first bootstrapping circuit adapted to regulate the voltage across Q1 such that said voltage remains constant.

28. The invention of claim 27 wherein said first bootstrapping circuit includes a transistor Q8.

29. The invention of claim 28 wherein the emitter of Q8 is coupled to the collector of Q1, the collector of Q8 is coupled to a power supply $V_{CC}$, and the base of Q8 is coupled to a current source I4.

30. The invention of claim 28 wherein said first bootstrapping circuit further includes a level shifting circuit for level shifting the voltage at said first node to the base of Q8.

31. The invention of claim 30 wherein said level shifting circuit includes one or more diodes connected in series.

32. A switch comprising:

an input circuit having a transistor Q1 for receiving an input signal;

first means for providing a path from an output of Q1 to an output terminal; and second means for receiving a control signal and in accordance therewith reducing the conductivity of said path during a mute mode, wherein said first means includes a first circuit for providing a first path from an output of Q1 to a first node, wherein said first means further includes a second circuit for providing a second path connecting said first node to said output terminal, wherein said second circuit includes a transistor Q4, and wherein said switch further includes a second bootstrapping circuit adapted to regulate the voltage across Q4 such that said voltage remains constant.

33. The invention of claim 32 wherein said second bootstrapping circuit includes a transistor Q6.

34. The invention of claim 33 wherein the emitter of Q6 is coupled to the collector of Q4, the collector of Q6 is coupled to a power supply $V_{CC}$, and the base of Q6 is coupled to a current source I5.

35. The invention of claim 33 wherein said second bootstrapping circuit further includes a level shifting circuit for level shifting the voltage at said output terminal to the base of Q6.

36. The invention of claim 35 wherein said level shifting circuit includes one or more diodes connected in series.

37. A switch comprising:

an input circuit having a transistor Q1 for receiving an input signal;

a first circuit for providing a first path from an output of Q1 to a first node;

a second circuit for providing a second path connecting said first node to an output terminal; and a third circuit for receiving a control signal and in accordance therewith applying a signal to said first node during a mute mode such that said first and second circuits are off or partially conducting, wherein said switch further includes a circuit for clamping said first node to a first predetermined voltage during said mute mode.

38. The invention of claim 37 wherein said switch further includes a circuit for clamping said output terminal to a second predetermined voltage during said mute mode.

39. The invention of claim 37 wherein said switch further includes a bootstrapping circuit for regulating the voltages across transistors in the signal path such that said voltages remain constant.

40. A method for coupling a first circuit to a second circuit during an active mode and isolating said first circuit from said second circuit during a mute mode including the steps of:

receiving an input signal from said first circuit with a transistor Q1;

providing a first path from an output of Q1 to a first node;

providing a second path coupling said first node to an output terminal connected to said second circuit; and reducing the conductivity of said first and second paths during said mute mode, wherein said method further includes clamping said output terminal to a first predetermined voltage during said mute mode.

41. The invention of claim 40 wherein said method further includes clamping said first node to a second predetermined voltage during said mute mode.

42. A method for coupling a first circuit to a second circuit during an active mode and isolating said first circuit from said second circuit during a mute mode including the steps of:

receiving an input signal from said first circuit with a transistor Q1;

providing a first path from an output of Q1 to a first node;

providing a second path coupling said first node to an output terminal connected to said second circuit; and reducing the conductivity of said first and second paths during said mute mode, wherein said method further includes regulating the collector-emitter voltages across any transistors in the signal path such that said voltages remain constant.

* * * * *